United States Patent [19]

Benjamin et al.

[11] Patent Number: 4,633,281

[45] Date of Patent: Dec. 30, 1986

[54] DUAL STACK POWER JFET WITH BURIED FIELD SHAPING DEPLETION REGIONS

[75] Inventors: James A. Benjamin, Waukesha, Wis.; Robert W. Lade, Fort Myers, Fla.; Herman P. Schutten, Milwaukee, Wis.

[73] Assignee: Eaton Corporation, Cleveland, Ohio

[21] Appl. No.: 618,431

[22] Filed: Jun. 8, 1984

[51] Int. Cl.$^4$ .................................... H01L 29/80
[52] U.S. Cl. ............................ 357/22; 357/20; 357/52; 357/55; 357/59; 357/41; 357/68; 357/86
[58] Field of Search .................. 357/20, 22, 25, 86, 357/59, 68, 41, 52

[56] References Cited

U.S. PATENT DOCUMENTS

| | | | |
|---|---|---|---|
| 2,820,154 | 1/1958 | Kurshan | 357/22 |
| 2,954,486 | 9/1960 | Doucette et al. | 357/22 |
| 2,989,713 | 6/1961 | Warner | 357/22 |
| 3,035,186 | 5/1962 | Doucette | 357/22 |
| 3,354,362 | 11/1967 | Zuleeg | 357/22 |
| 3,878,552 | 4/1975 | Rodgers | 357/55 |
| 4,338,618 | 7/1982 | Nishizawa | 357/22 |

FOREIGN PATENT DOCUMENTS

| | | |
|---|---|---|
| 0053854 | 6/1982 | European Pat. Off. . |
| 0083815 | 7/1983 | European Pat. Off. . |
| 3345189 | 6/1984 | Fed. Rep. of Germany . |
| 1377330 | 9/1964 | France . |
| 2152656 | 4/1973 | France . |
| 2454703 | 11/1980 | France . |

OTHER PUBLICATIONS

"Simultaneous Modulation of Electron and Hole Conductivity in a New Periodic GaAs Doping Multilayer Structure", K. Ploog et al., Applied Physics Letters, vol. 38, No. 11, Jun. 1981, pp. 870-873, New York.

*Primary Examiner*—Joseph E. Clawson, Jr.
*Attorney, Agent, or Firm*—Andrus, Sceales, Starke & Sawall

[57] ABSTRACT

A power JFET (2) has a common drift region (4) between a pair of spaced first and second stacks (6, 8) of alternating conductivity type layers (10-14 and 15-19) forming a plurality of channels (11, 13, 16 and 18). The JFET has an ON state conducting bidirectional current horizontally through the common drift region and the channels. The channels are stacked vertically, and the JFET has an OFF state blocking current flow through the channels due to vertical depletion pinch-off. Field shaping and high blocking voltage capability are provided. Particular main terminal and gate structure is disclosed.

3 Claims, 7 Drawing Figures

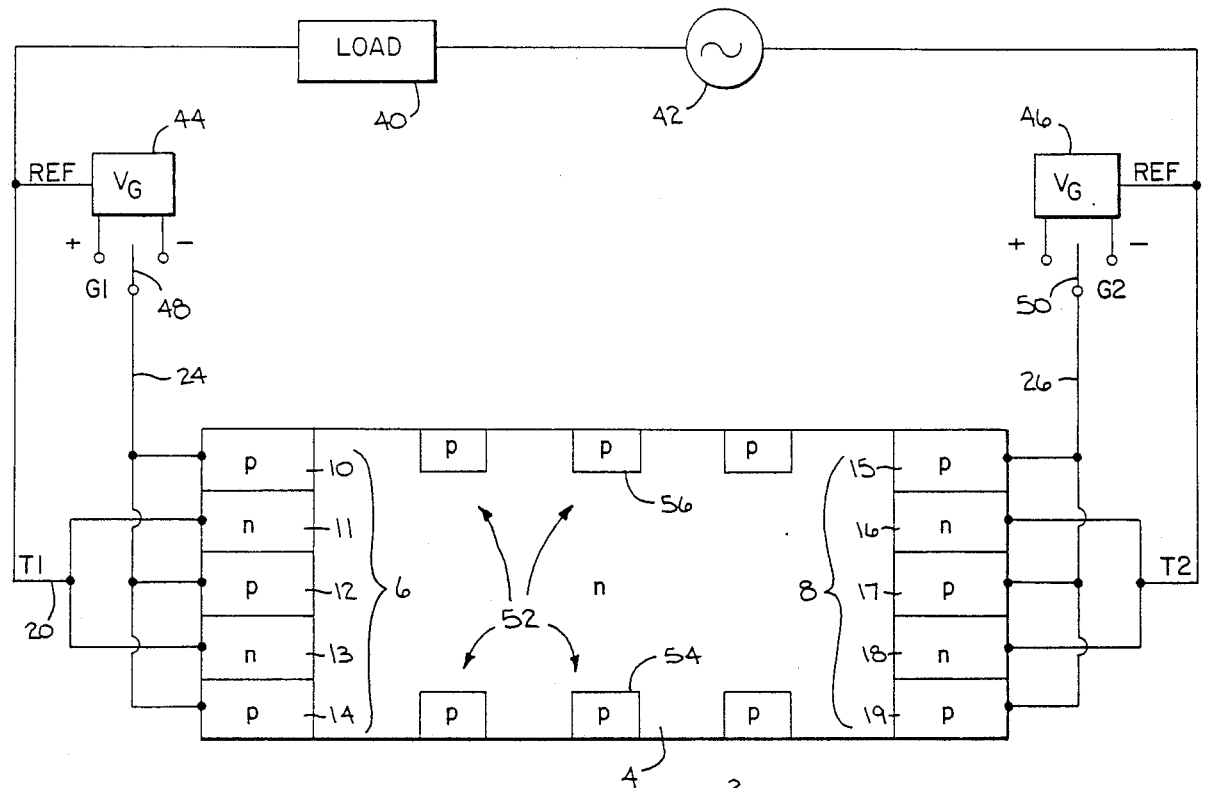
FIG. 1
FIG. 2
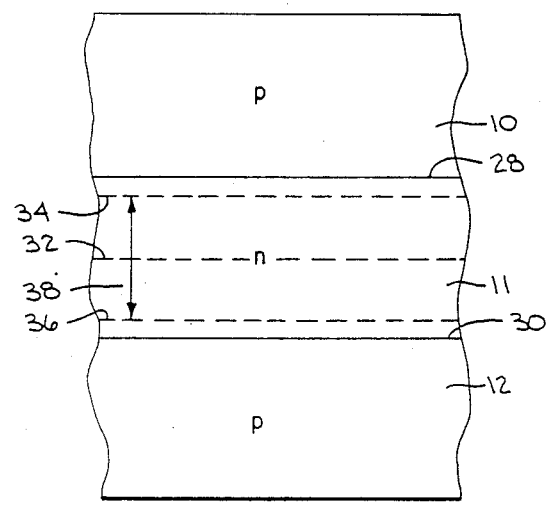

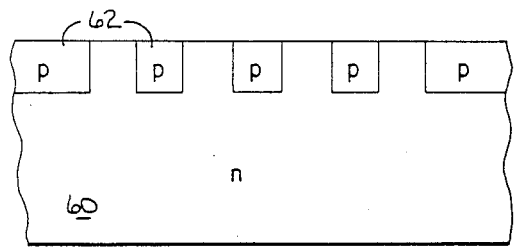
FIG. 3
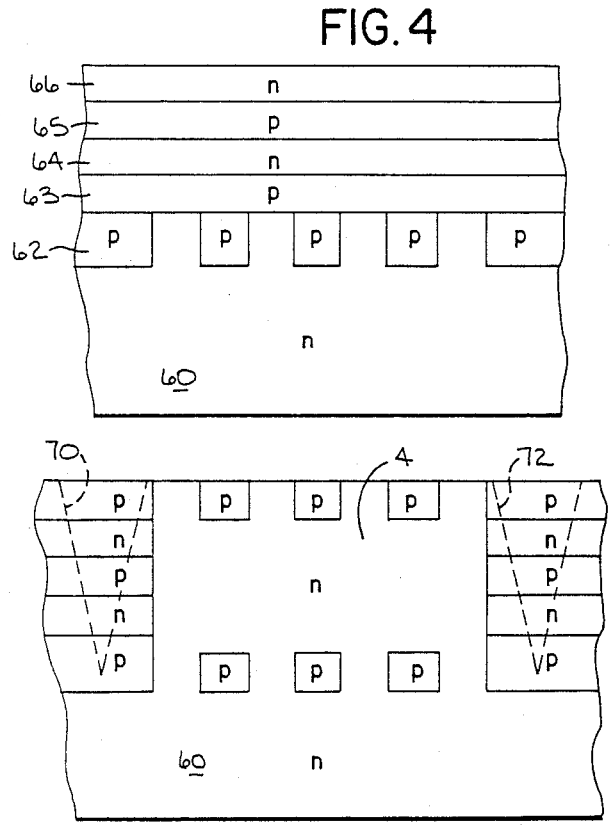
FIG. 4
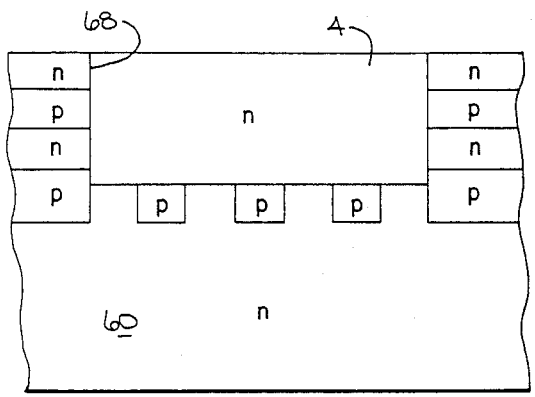
FIG. 5
FIG. 6
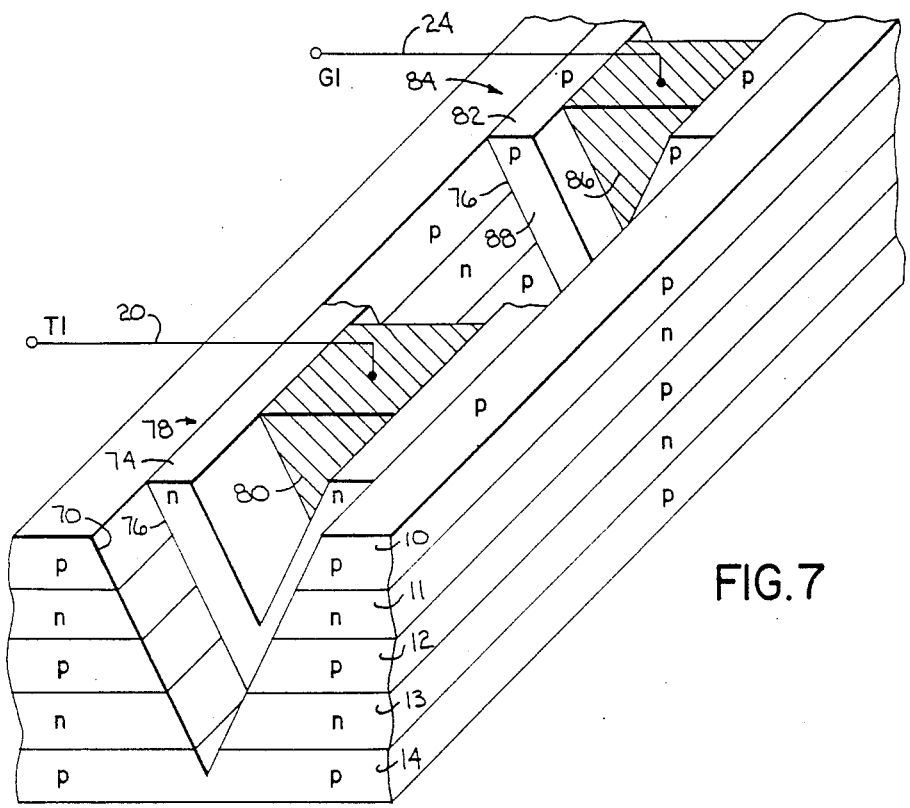
FIG. 7

DUAL STACK POWER JFET WITH BURIED FIELD SHAPING DEPLETION REGIONS

BACKGROUND AND SUMMARY

The invention relates to a junction field effect transistor (JFET) affording high blocking voltage capability, including AC application.

A power JFET is provided having a common drift region between a pair of spaced first and second stacks of alternating conductivity type layers forming a plurality of channels. Bidirectional current is conducted through the channels and common drift region in an ON state. In the OFF state, current flow is blocked by depletion region pinch-off in the channels.

Linear geometry enables desirable control of breakdown voltage, and in turn a higher blocking voltage capability. ON state conduction current flows longitudinally horizontally through the common drift region, with consequent desirable bulk effect characteristics.

The channels are stacked vertically at opposite ends of the drift region, with current flowing horizontally through the channels in the ON state, and being pinched-off in the OFF state by vertical depletion region spreading. Multiple channels reduce the channel component of the ON state resistance.

Field shaping regions are provided in the common drift region for straightening field lines therein and reducing gradient curvature crowding of the field lines, e.g. radius or corner curvature. The field shaping regions are in the bulk drift region, removed from the active area of the channel junctions between the alternate conductivity layers in the stacks.

BRIEF DESCRIPTION OF THE DRAWINGS

FIG. 1 is a schematic sectional view showing power JFET structure constructed in accordance with the invention.

FIG. 2 is an enlarged isolated section of FIG. 1 illustrating a conduction channel, and depletion region pinch-off.

FIGS. 3-6 illustrate sequential processing steps for forming the structure of the invention.

FIG. 7 is an enlarged isometric illustration of a portion of FIG. 1 showing the preferred main and gate terminal structure.

DETAILED DESCRIPTION

FIG. 1 shows a power JFET 2 having a common drift region 4 between a pair of spaced first and second stacks 6 and 8 of alternating conductivity type layers such as 10-14 and 15-19 forming a plurality of channels such as 11, 13, 16 and 18. JFET 2 has an ON state conducting bidirectional current through common drift region 4 and the noted channels. JFET 2 has an OFF state blocking current flow through the channels due to depletion region pinch-off.

Drift region 4 and the noted channels, such as 11, 13, 16 and 18, are of one conductivity type, such as n type. First main terminal means T1, described in greater detail hereinafter in connection with FIG. 7, is connected to the channels such as 11 and 13 of first stack 6, as shown at 20 in FIG. 1. Second main terminal means T2 is connected to the channels such as 16 and 18 of second stack 8, as shown at 22. First gate terminal means G1 is connected to the other conductivity type layers such as players 10, 12 and 14 in first stack 6, as shown at 24. Second gate terminal means G2 is connected to the other conductivity type layers such as p layers 15, 17 and 19 in second stack 8, as shown at 26.

Referring to FIG. 2, depletion region spreading from the junctions such as 28 and 30 between the layers of the stacks cause the noted pinch-off OFF state. When the depletion region spreading downwardly from junction 28 meets the depletion region spreading upwardly from junction 30, as shown at interface dashed line 32, channel 11 is pinched OFF, and current cannot flow through channel 11 from right to left, or from left to right.

Depletion region shrinking toward the junctions between the layers in the stacks enable the noted ON state. For example, in FIG. 2, depletion region shrinking upwardly toward junction 28, as shown at dashed line 34, and depletion region shrinking downwardly toward junction 30, as shown at 36, open a conductive region of width 38 through channel 11. Current may flow leftwardly or rightwardly through channel 11.

FIG. 1 shows power JFET 2 connected in an AC load line, including load 40 and AC power source 42. In the ON state, during the first half cycle of AC source 42, current flows rightwardly through JFET 2, namely from left main terminal T1 through conduction channels 11 and 13, through common drift region 4, through conduction channels 16 and 18 to right main terminal T2, to complete a circuit through load 40. In the other half cycle of AC source 42, current flows leftwardly through JFET 2, namely from right main terminal T2 through conduction channels 16 and 18, through common drift region 4, through conduction channels 11 and 13 to left main terminal T1.

In the preferred embodiment, JFET 2 is normally OFF. The depletion regions from p layers such as 10 and 12, FIG. 2, normally extend toward and meet each other, as at 32, in the absence of bias on the gate terminals, such that the channels such as 11 are normally pinched OFF. JFET 2 is turned ON by biasing gate terminals G1 and G2 to shrink the depletion regions and open conductive channels, such as 38, FIG. 2, such that current can flow between main terminals T1 and T2. Gating voltage sources 44 and 46 are referenced to respective main terminals T1 and T2 and provide the relatively positive gate bias when respective switches 48 and 50 are in their leftward position. Referring to FIG. 2, junctions 28 and 30 are then forward biased, and the depletion regions in layer 11 shrink toward the junctions to open the conductive channel of width 38. In one form of this embodiment, affording a device blocking 1,000 volts in the OFF state, the horizontal length of common drift region 4 between stacks 6 and 8 is about 60 microns. The vertical width or height of the n type channel layers such as 11 is about 3000 to 5000 angstroms. The width or height of the p type layers is arbitrary according to processing. The n type regions have a concentration of about $10^{14}$ or $10^{15}$ atoms per cubic centimeter, and the concentration of the p type regions is about $10^{17}$ or $10^{18}$ atoms per cubic centimeter.

In an alternate embodiment, JFET 2 is normally ON. The depletion regions from the p type layers, such as 10 and 12 in FIG. 2, normally extend only partially towards each other, as shown at 34 and 36, in the absence of gate bias, to leave open conductive channel 11, as shown at 38, such that current can flow between main terminals T1 and T2. JFET 2 is turned OFF by biasing first and second gate terminals G1 and G2 to spread the depletion regions and pinch-off the channels, as shown at 32, FIG. 2. With switches 48 and 50 in their rightward position, a relatively negative gate bias is applied, to thus reverse bias the junctions between the layers in stacks 6 and 8. For example, reverse biasing of junctions 28 and 30, FIG. 2, spreads the depletion regions to pinch-off the channel, as shown at 32.

As seen in FIG. 1, current flows through the conduction channels and through drift region 4 in a direction perpendicular to the direction of stacking of the layers. Current flows horizontally through the n layer conduction channels and through common drift region 4. The layers at the opposite or distal ends of drift region 4 extend horizontally longitudinally and laterally such that the direction of stacking extends vertically.

Field shaping means 52 is provided in common drift region 4 and is removed from the active area of the junctions between the layers of stacks 6 and 8. Field shaping means 52 comprises one or more regions such as 54 of the noted other conductivity type, such as p type, for straightening field lines in drift region 4 and reducing gradient curvature crowding of the field lines, whereby to increase blocking voltage capability. In preferred form, field shaping means 52 comprises one or more floating depletion regions not tied to any source of bias potential. Vertically opposed depletion regions such as 54 and 56 provide the noted field shaping.

Referring to FIGS. 3–6, the formation of JFET 2 is initiated with a substrate such as n type layer 60. A masked p type diffusion yields p type regions 62, FIG. 3. Next, alternating conductivity layers such as 63–66, FIG. 4, are sequentially epitaxially grown on the top of the substrate. The epitaxial layers are then centrally etched, at 68, FIG. 5, followed by an n type deposition yielding central n type region 4 which is the common drift region in the finished structure. A masked p type diffusion is then performed, to yield the structure shown in FIG. 6, which is the same as FIG. 1 except for the additional n type substrate 60 which is preferred.

First main terminal means T1 at 20, FIG. 1, comprises a first main terminal layer of semiconductor material of the noted one conductivity type, such as n type, extending across and contacting the layers of first stack 6, and a first main electrode contacting the first main terminal layer. The first gate terminal G1 at 24 comprises a first gate layer of semiconductor material of the noted other conductivity type, such as p type, extending across and contacting the layers of first stack 6, and a first gate electrode contacting the first gate layer. The second main terminal T2 at 22 and the second gate terminal G2 at 26 are respectively comparable for right stack 8.

Referring to FIG. 7, a first groove 70 is notched vertically into first stack 6. Groove 70 may be V-shaped or U-shaped, and formed by anisotropic etching, plasma etching, or other suitable means, as known in the art: C. Hu "A Parametric Study Of Power MOSFETs", IEEE Electron Device Conference, Paper CH1461-3/79, 0000-0385; IEEE Transactions Electron Devices, Volume ED-25, No. 10, October, 1978; and Ammar and Rogers, "UMOS Transistors On Silicon", Transactions IEEE, ED-27, pages 907–914, May, 1980. A second groove is formed in second stack 8. These grooves are shown at dashed lines 70 and 72 in FIG. 6. Each groove extends downwardly into its respective stack 6 or 8 and into the bottommost layer, for example layer 14 in stack 6, and through each layer thereabove. The first main terminal means T1 and the first gate terminal means G1 are in groove 70, and the second main terminal means T2 and the second gate terminal means G2 are in groove 72 in stack 8.

The first main terminal means comprises a layer 74, FIG. 7, of semiconductor material of the noted one conductivity type, such as n type, extending along the inner surface 76 of groove 70 in a first section 78 thereof to contact the layers 10–14 of first stack 6. The first main terminal means also comprises a first main electrode 80 contacting first main terminal layer 74. Electrode 80 is preferably aluminum or polysilicon.

The first gate terminal means comprises a first gate layer 82 of semiconductor material of the noted other conductivity type, such as p type, extending along the inner surface 76 of groove 70 in a second section 84 thereof to contact the layers 10–14 of first stack 6. The first gate terminal means also comprises a first gate electrode 86 contacting first gate layer 82. Gate electrode 86 is preferably aluminum or polysilicon.

Main electrode 80 and gate electrode 86 are laterally spaced and separated in groove 70 to prevent ohmic contact therebetween. First main terminal layer 74 and first gate layer 82 are in contact and are contiguous along an interface such as 88 forming a junction therebetween. This junction 88 has a forward voltage drop thereacross great enough to prevent shorting of the junctions between the layers of stack 6, such as junctions 28 and 30, FIG. 2. This ensures a sufficient voltage differential across the channel junctions such as 28 and 30 to enable depletion region shrinking toward the junctions such as 28 and 30, enabling the noted ON state. The voltage drop across junction 88 and across the channel junctions such as 28 and 30 is typically about 0.7 volts, due to the noted carrier concentrations, which are likewise used for p layer 82 and n layer 74.

The lower row of field shaping depletion regions such as 54 in common drift region 4 are substantially horizontally coplanar with the bottom layers such as 14 and 19 of stacks 6 and 8. The upper row of field shaping depletion regions such as 56 in common drift region 4 are substantially horizontally coplanar with the top layers such as 10 and 15 of stacks 6 and 8. As noted, the upper and lower rows of depletion regions provide straightening of field lines therebetween to reduce gradient curvature crowding and increase blocking voltage capability.

It is recognized that various modifications are possible within the scope of the appended claims.

We claim:

1. A bidirectional power JFET for AC operation comprising:
    a semiconductor substrate of one conductivity type comprising a thin flat wafer lying in a horizontal plane and having top and bottom horizontal major surface;
    a left set of a plurality of horizontal layers of alternating conductivity type semiconductor material vertically stacked in said substrate, the horizontal layers of said one conductivity type defining a plurality of horizontial channels extending left-right and interdigitated with horizontal layers of the other conductivity type and forming a plurality of respective horizontal interface channel junctions therewith;
    a right set of a plurality of horizontal layers of alternating conductivity type semiconductor material vertically stacked in said substrate and spaced rightwardly of said left stack, the horizontal layers of said one conductivity type defining a plurality of horizontal channels extending left-right and interdigitated with horizontal layers of the other conductivity type and having a plurality of respective horizontal interface channel junction therewith;

a common drift region of said one conductivity type in said substrate between and separating said left and right stacks, and providing a horizontal left-right conduction path through said common drift region between said left and right stacks;

first main terminal means operatively coupled to the left end of said channels in said left stack;

second main terminal means operatively coupled to the right end of said channels in said right stack;

a source of alternating voltage impressed across said first and second main terminal means;

first gate terminal means operatively coupled to said other conductivity type horizontal layers in said left stack;

second gate terminal means operatively coupled to said other conductivity type horizontal layers in said right stack;

first gate voltage bias means connected to said first gate terminal means and applying a gating bias potential to said other conductivity type horizontal layers in said left stack, such that for a first polarity of said first gate bias means, said channel junctions of said left stack are forward biased and depletion regions therearound shrink vertically toward said channel junctions to open a conductive horizontal left-right current path through said channels between said first main terminal means and said common drift region, and such that for a second polarity of said first gate bias means, said channel junctions of said left stack are reverse biased and depletion regions therearound expand vertically from said channel junctions to close said horizontal current path and block conduction between said first main terminal means and said common drift region;

second gate voltage bias means connected to said second gate terminal means and applying a gating bias potential to said other conductivity type horizontal layers of said right stack, such that for a first polarity of said second gate bias means, said channel junctions of said right stack are forward biased and depletion regions therearound shrink vertically toward said channel juctions to open a conductive horizontal current path through said channels between said second main terminal means and said common region, and such that for a second polarity of said second gate bias means, said channel junctions of said right stack are reverse biased and depletion regions therearound expand vertically away from said channel junctions to close said horizontal current path and block conduction between said main terminal means and said common drift region;

a lower row of field shaping depletion regions of said other conductivity type in said common drift region substantially horizontally coplanar with the bottom layers of said stacks and buried in said substrate and spaced above said bottom horizontal major surface;

an upper row of field shaping depletion regions of said other conductivity type in said common drift region substantially horizontally coplanar with the top layers of said stacks and disposed at said top horizontal major surface and symmetrically aligned with said lower row of field shaping depletion regions;

said upper and lower rows of depletion regions providing straightening of field lines therebetween to reduce gradient curvature crowding and increase voltage blocking capability and providing symmetrical operation regardless of polarity to thus enable symmetric bidirectional current flow through said drift region between said left and right stacks and to enable symmetric OFF state voltage blocking capability.

2. The invention according to claim 1 wherein:

said first gate terminal means in connected both to said other conductivity horizontal layers in said left stack and to said one conductivity type horzontal layers in said left stack forming said channels;

said first gate bias means is referenced to said first main terminal means;

said second gate terminal means is connected both to said other conductivity type horizontal layers in said right stack and to said one conductivity type horizontal layers in said right stack forming said channels;

said second bias means is referenced to said second main terminal means; and comprising means preventing electrical shorting of said first gate terminal means to said one conductivity type layers in said left stack when said channel junctions of said left stack are forward biased and said first gate bias means is at said first polarity; and comprising means preventing electrical shorting of said second gate terminal means to said one conductivity type layers in said right stack when said channel junctions of said right stack are forward biased and said second gate bias means is at said first polarity.

3. The invention according to claim 2 comprising a first forward-rearward groove notched vertically into said left stack, and wherein:

said first gate terminal means and said first main terminal means are each in the same said first groove;

said first main terminal means comprises a first main electrode and a semiconductor layer of said one conductivity type, said first main electrode contacting said last mentioned semiconductor layer, said last mentioned semiconductor layer extending across and contacting said one and said other conductivity type horizontal layers of said left stack;

said first gate terminal means comprises a first gate electrode and a semiconductor layer of said other conductivity type, said first gate electrode contacting said last mentioned semiconductor layer, said last mentioned semiconductor layer extending across and contacting said one and said other conductivity type horizontal layers of said left stack;

said one conductivity type semiconductor layer of said first main terminal means contacts and forms a vertical junction in said first groove with said other conductivity type semiconductor layer of said first gate terminal means;

said first main electrode and said first gate electrode are spaced forward-rearward and ohmically separated in said first groove; and comprising a second forward-rearward groove notched vertically into said right stack, and wherein:

said second gate terminal means and said second main terminal means are each in the same said second groove;

said second main terminal means comprises a second main electrode and a semiconductor layer of said one conductivity type, said second main electrode contacting said last mentioned semiconductor layer, said last mentioned semiconductor layer extending across and contacting said one and said other conductivity type horizontal layers of said right stack;

said second gate terminal means comprises a second gate electrode and a semiconductor layer of said other conductivity type, said second gate electrode contacting said last mentioned semiconductor layer, said last mentioned semiconductor layer extending across and contacting said one and said other conductivity type horizontal layers of said right stack;

said one conductivity type semiconductor layer of said second main terminal means contacts and forms a vertical junction in said second groove with said other conductivity type semiconductor layer of said second gate terminal means; and said second main electrode and said second gate electrode are spaced forward-rearward and ohmically separated in said second groove.

* * * * *